United States Patent
Chuang et al.

(10) Patent No.: US 6,921,694 B2
(45) Date of Patent: Jul. 26, 2005

(54) METHOD FOR FABRICATING FLOATING GATE

(75) Inventors: Ying-Cheng Chuang, Bade (TW); Chung-Lin Huang, Taichung (TW); Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/442,308

(22) Filed: May 19, 2003

(65) Prior Publication Data

US 2003/0235954 A1 Dec. 25, 2003

(30) Foreign Application Priority Data

Jun. 21, 2002 (TW) .......................... 91113597 A

(51) Int. Cl.$^7$ ........................................... H01L 21/336
(52) U.S. Cl. ......................... 438/257; 257/315
(58) Field of Search .............................. 438/257–267, 438/593–594, 260, 717, 733, 770; 257/314–315, 321

(56) References Cited

U.S. PATENT DOCUMENTS

| | | | | |
|---|---|---|---|---|
| 5,907,775 A | * | 5/1999 | Tseng | 438/261 |
| 6,165,845 A | * | 12/2000 | Hsieh et al. | 438/260 |
| 6,194,300 B1 | * | 2/2001 | Hung et al. | 438/593 |

* cited by examiner

*Primary Examiner*—David Vu
(74) *Attorney, Agent, or Firm*—Ladas & Parry LLP

(57) ABSTRACT

A method for fabricating a floating gate with multiple tips. A semiconductor substrate is provided, on which an insulating layer and a patterned hard mask layer are sequentially formed. The patterned hard mask layer has an opening to expose the surface of the semiconductor substrate. A conducting layer is conformally formed on the patterned hard mask layer, and the opening is filled with the conducting layer. The conducting layer is planarized to expose the surface of the patterned hard mask layer. The conducting layer is thermally oxidized to form an oxide layer, and the patterned hard mask layer is removed.

9 Claims, 4 Drawing Sheets

METHOD FOR FABRICATING FLOATING GATE

BACKGROUND OF THE INVENTION

1. Field of the Invention

The invention relates to a semiconductor process, and more particularly to a floating gate fabrication process to form a floating gate with multiple tips.

2. Description of the Related Art

Memory devices for non-volatile storage of information are currently in widespread use, in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

An advantage of EPROM is that it is electrically programmed, but for erasing, EPROM requires exposure to ultraviolet (UV) light.

In many circuit designs it is desirable to have a non-volatile memory device that can be erased and reprogrammed in-circuit, without the need to remove the device. EEPROM devices have the advantage of electrical programming and erasing, achieved by charging and discharging actions controlled by the control gate. The actions also affect the conductivity of the channel between source and drain.

One of the advantages of flash memory is its capacity for block-by-block memory erasure. Furthermore, memory erasure is fast, normally taking just 1 to 2 seconds for the complete removal of a whole block of memory. Another advantage of the flash memory is low power consumption. The voltages of a control gate, a source, and a drain are adjusted to program or erase in a split gate flash memory.

FIGS. 1a to 1c are cross-sections of the conventional method of fabricating a floating gate of a split gate flash memory.

In FIG. 1a, a silicon substrate 101 is provided. A gate oxide layer 102, a doped polysilicon layer 103, and a nitride layer 104 having an opening 105 are sequentially formed on the silicon substrate 101.

In FIG. 1b, the doped polysilicon layer 105 exposed by the opening 105 is oxidized to form an oxide layer 106 with a Bird's Beak shape edge.

In FIG. 1c, the nitride layer 104 is removed. The doped polysilicon layer 103 is anisotropically etched to form a floating gate 103a using the oxide layer 106 as an etching mask.

A split gate flash memory is completed after a control gate is formed on the floating gate and the silicon substrate 101 is implanted to form source/drain devices.

In the program step, high voltage is applied between the source and drain. Another high voltage is applied to the control gate and goes to the floating gate because of the electric capacity coupling, and a high electric field is produced on the film gate oxide layer. The electricity is injected into the floating gate through the film gate oxide layer from the drain.

In the erase step, a high voltage is applied between the drain and the control gate. A high electric field is produced on the film gate oxide layer because of the electric capacity coupling. The electricity injects into the drain through the film gate oxide layer from the floating gate, such that the gate oxide layer is damaged by the high voltage.

When the edge of the floating gate is a tip, the electric field is easily concentrated in the tip, and the point is easily discharged. If the point discharge is increased, the erase effect is strong.

In addition, die size is larger due to the addition of programming circuitry and there are more processing and testing steps involved in the manufacture of these types of memory devices.

SUMMARY OF THE INVENTION

The present invention is directed to a method for fabricating a floating gate with multiple tips.

Accordingly, the present invention provides a method for fabricating a floating gate. A semiconductor substrate is provided with an insulating layer and a patterned hard mask layer having an opening to expose the surface of the semiconductor substrate sequentially formed thereon. A conducting layer is conformally formed on the surface of the patterned hard mask layer, and the opening is filled with the conducting layer. The conducting layer is planarized to expose the surface of the patterned hard mask layer. The conducting layer is thermally oxidized to form an oxide layer. The patterned hard mask layer is removed.

Accordingly, the present invention provides a method for fabricating a floating gate. A semiconductor substrate is provided with a gate oxide layer, a hard mask layer, and a patterned photoresist layer sequentially formed thereon. The hard mask layer is etched to form an opening using the patterned resist layer as a mask. The patterned photoresist layer is removed. A polysilicon layer is conformally formed on the surface of the hard mask layer and the semiconductor substrate. A protecting layer is conformally formed on the surface of the polysilicon layer. The protecting layer and the polysilicon layer are sequentially chemical mechanical polished to expose the surface of the hard mask layer, and the protecting layer is removed. The polysilicon layer is oxidized to form an oxidized polysilicon layer. The hard mask layer and the gate oxide layer where the surface is exposed are sequentially etched using the oxidized polysilicon layer as a mask.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1A:
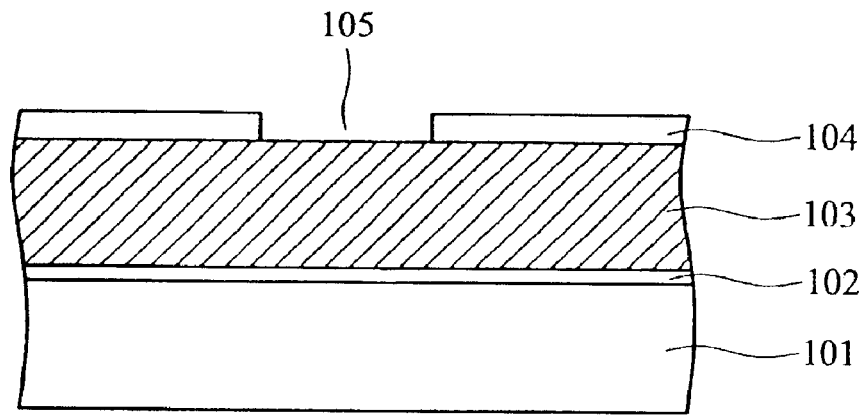
FIGS. 1a to 1c are cross-sections of the conventional method for fabricating a floating gate of a split gate flash memory.
Figure 1B:
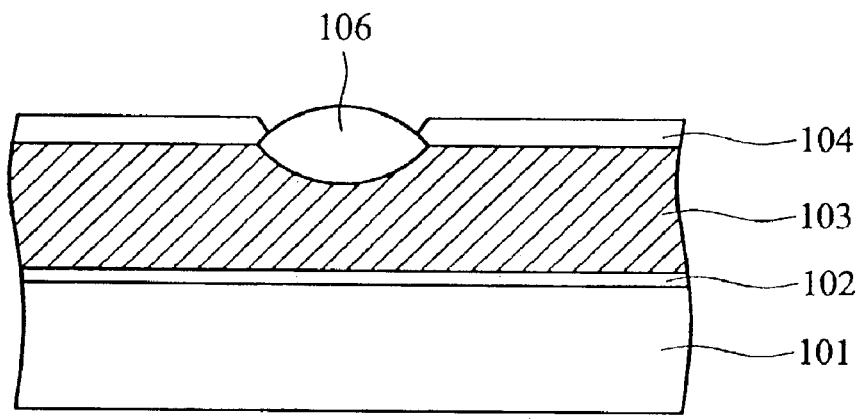
Figure 1C:
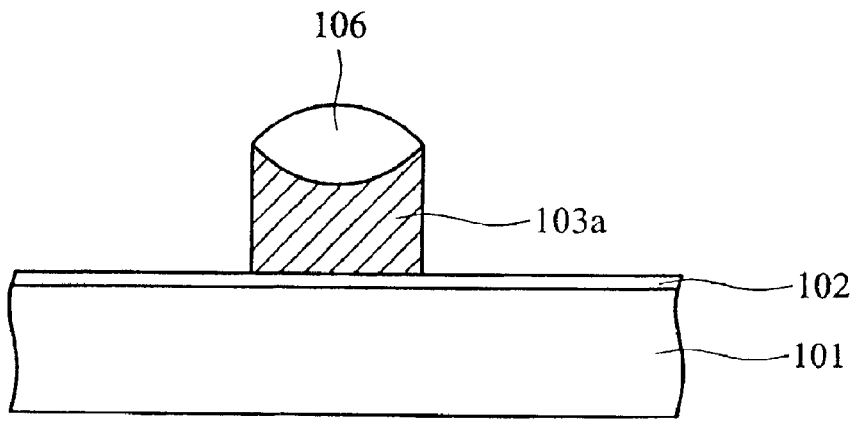
Figure 2A:
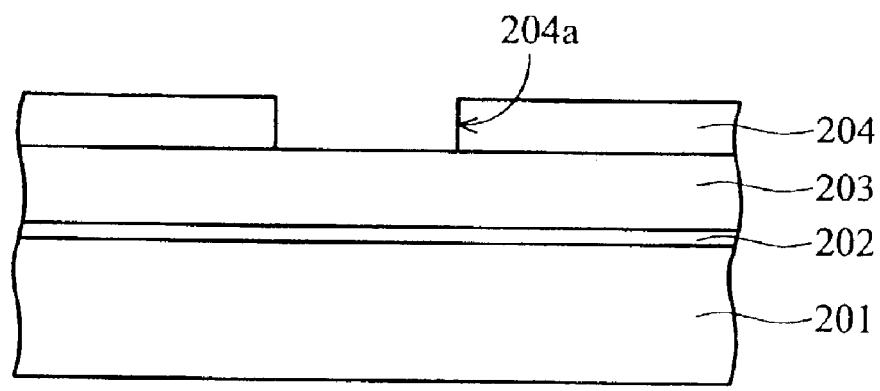
FIGS. 2a to 2g are cross-sections of the method for fabricating a floating gate of a split gate flash memory of the present invention.

In FIG. 2a, a semiconductor substrate 201 is provided, and an insulating layer 202, such as gate oxide layer, a hard mask layer 203, such as silicon nitride layer preventing the poly from oxidization, and a photoresist layer 204 with an opening 204a are sequentially formed thereon. The hard mask layer 204 prevents underlying materials from oxidization.

Figure 2B:
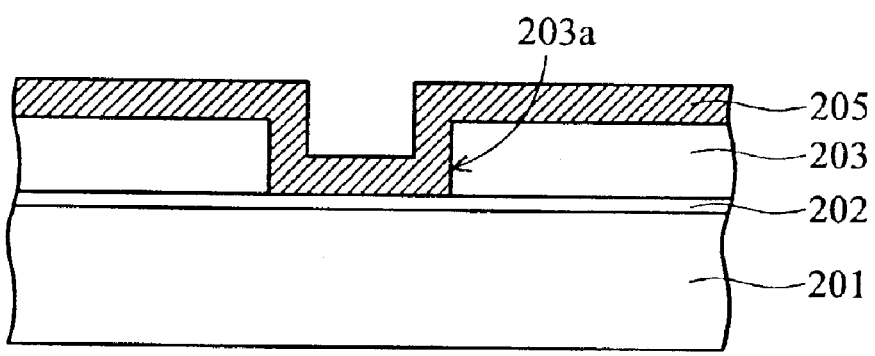

In FIG. 2b, the hard mask layer 203 is anisotropically etched to form an opening 203a to expose the surface of the insulating layer 202 using the photoresist layer 204 having the opening 204 as a mask. The patterned photoresist layer 204 is removed, and a conducting layer 205, such as polysilicon layer, is conformally formed on the surface of the hard mask layer 203 and the opening 203a.

Figure 2C:
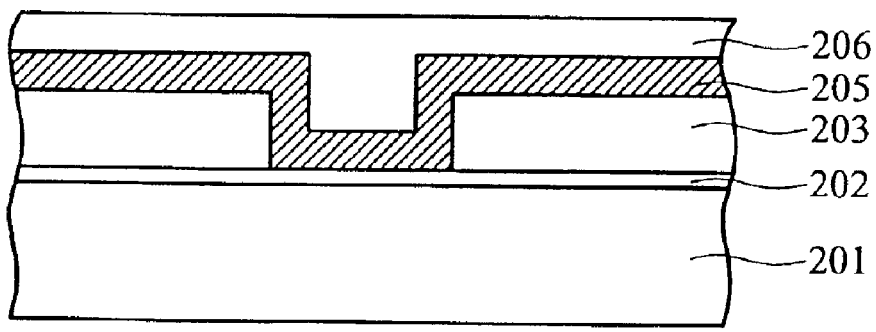
Figure 2D:
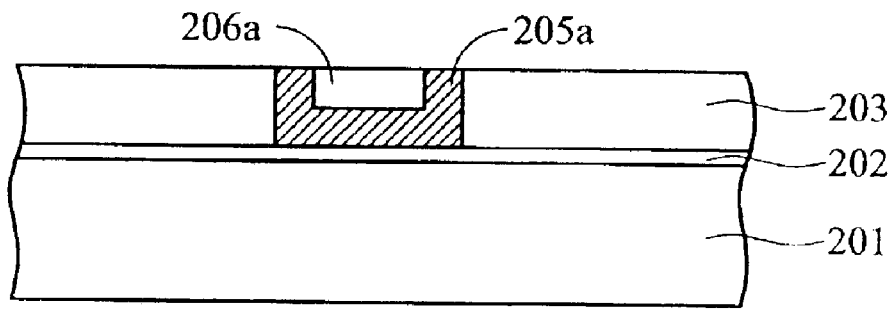

In FIG. 2c, a protecting layer 206, such as silicon oxide layer, is formed on the surface of the conducting layer 205, and the opening 203a is filled with the protecting layer 206. The protecting layer 206 and the conducting layer 205 are sequentially chemical mechanical polished to expose the surface of the hard mask layer 203, and the conducting layer 205a and the protecting layer 206a are formed. The protecting layer 206a prevents oxidization of the conducting layer 205 of the opening 203a.

Figure 2E:
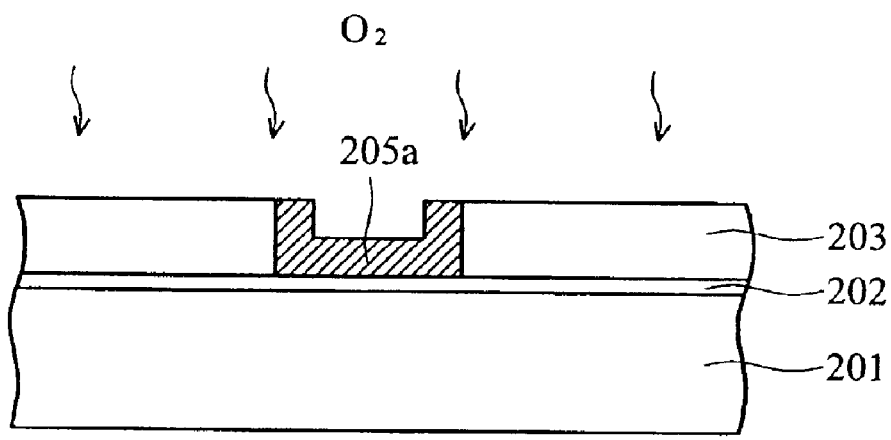

In FIG. 2e, the conducting layer 205a of the opening 203a is thermally oxidized to form an oxide layer 207 after the protecting layer 206a is removed. The hard mask layer 203 prevents oxidization of semiconductor substrate 201.

Figure 2F:
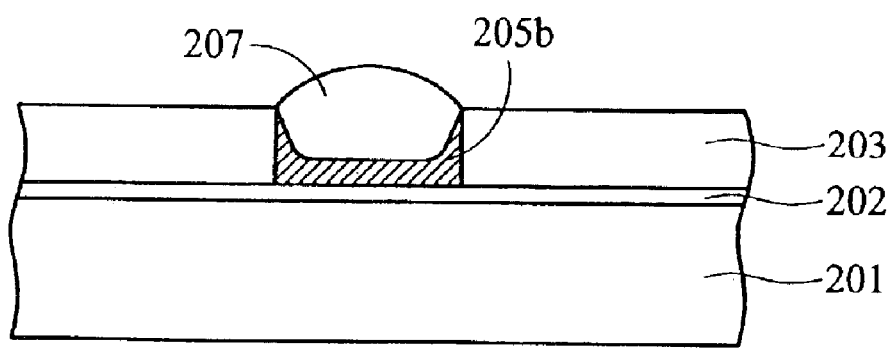

In FIG. 2f, the oxide layer 207 in the opening 203a is oxidized, and a Bird's Beak shape edge is formed by means of the oxidation rate of the bottom corner of the opening 203a being faster, and the oxidized depth of the bottom corner of the opening 203a being deeper than in other areas of the layer. The oxidizing step uses thermal oxidation.

Figure 2G:
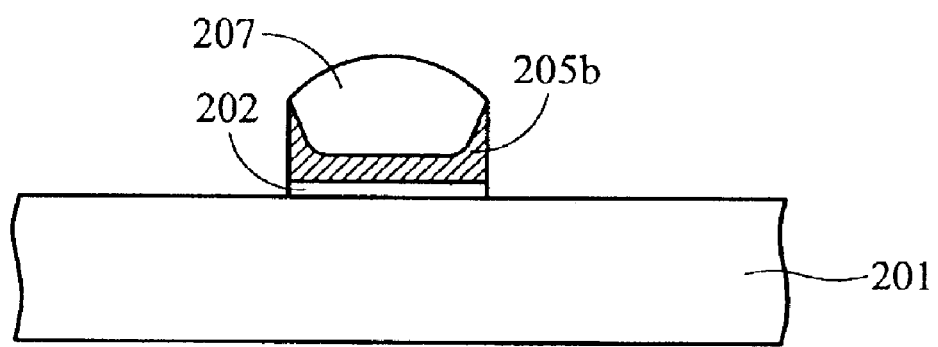

In FIG. 2g, the hard mask layer 203a and the insulating layer 202 underlying the hard mask layer 203 are etched using the oxide layer 207 as a mask. The remaining conducting layer functions as a floating gate 205b.

Concentration of the electric field easily occurs in the tip, and the point is easily discharged. Point discharge is increased because of the floating gate's multiple tips in the present invention. Thus, data erase for the flash memory having the floating gate with multiple tips is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a floating gate, comprising:
   providing a semiconductor substrate, with a gate oxide layer and a patterned hard mask layer having an opening sequentially formed thereon;
   conformally forming a conducting layer on the surface of the patterned hard mask layer and the opening, wherein the opening is partially filled with the conducting layer;
   planarizing the conducting layer to expose the surface of the patterned hard mask layer; thermally oxidizing the conducting layer to form an oxide layer; and
   removing the patterned hard mask layer.

2. The method for fabricating a floating gate as claimed in claim 1, wherein the patterned hard mask layer comprises an oxide layer and a nitride layer.

3. The method for fabricating a floating gate as claimed in claim 1, wherein the conducting layer comprises a polysilicon layer.

4. The method for fabricating a floating gate as claimed in claim 1, wherein the oxide layer comprises a silicon oxide layer.

5. The method for fabricating a floating gate as claimed in claim 1, wherein planarization is by chemical mechanical polishing.

6. A method for fabricating a floating gate, comprising:
   providing a semiconductor substrate;
   sequentially forming a gate oxide layer, a hard mask layer, and a patterned photoresist layer thereon;
   etching the hard mask layer to form an opening using the patterned photoresist layer as a mask;
   removing the patterned photoresist layer;
   conformally forming a polysilicon layer on the surface of the hard mask layer and the semiconductor substrate;
   conformally forming a protecting layer on the surface of the polysilicon layer;
   chemical mechanical polishing the protecting layer and the polysilicon layer to expose the surface of the hard mask layer;
   removing the protecting layer;
   oxidizing the polysilicon layer to form a polysilicon oxide layer; and sequentially etching the hard mask layer and the gate oxide layer using the polysilicon oxide layer as a mask.

7. The method for fabricating a floating gate as claimed in claim 6, wherein the hard mask layer comprises a silicon nitride layer and a silicon oxide layer.

8. The method for fabricating a floating gate as claimed in claim 6, wherein the protecting layer comprises an oxide layer.

9. The method for fabricating a floating gate as claimed in claim 6, wherein the etching method uses anisotropic etching.

* * * * *